United States Patent
Bechtel et al.

(10) Patent No.: US 11,233,180 B2
(45) Date of Patent: Jan. 25, 2022

(54) PHOSPHOR CONVERTED LED WITH HIGH COLOR QUALITY

(71) Applicant: Lumileds LLC, San Jose, CA (US)

(72) Inventors: Hans-Helmut Bechtel, Aachen (DE);
Gregoire Denis, San Jose, CA (US);
Erik Maria Roeling, Aachen (DE);
Danielle Russell Chamberlin, Belmont, CA (US); Sumit Gangwal, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/119,688

(22) Filed: Aug. 31, 2018

(65) Prior Publication Data
US 2020/0075815 A1    Mar. 5, 2020

(51) Int. Cl.
*H01L 33/60*      (2010.01)
*H01L 33/50*      (2010.01)
(Continued)

(52) U.S. Cl.
CPC .......... *H01L 33/504* (2013.01); *C09K 11/025* (2013.01); *C09K 11/7734* (2013.01); *H01L 33/58* (2013.01); *H01L 33/60* (2013.01)

(58) Field of Classification Search
CPC ... H01L 33/50–508; H01L 33/502–504; H01L 33/58–60; H01L 2933/0041; H01L 2933/0058; H01L 2933/0083; H01L 2933/0091; C09K 11/025; C09K 11/7734; C09K 11/0883; C09K 11/665;
(Continued)

(56) References Cited

U.S. PATENT DOCUMENTS

2006/0091779 A1   5/2006   Takeda et al.
2009/0072255 A1*   3/2009   Takahashi ............ C09K 11/774
                                                                                257/98
(Continued)

FOREIGN PATENT DOCUMENTS

EP    2544252 A1    1/2013
EP    3206240 A1    8/2017
(Continued)

OTHER PUBLICATIONS

Barry, Equilibria and Eu2+ luminescence of subsolidus phases bounded by Ba3MgSi2O8, Sr3MgSi2O8, and Ca3MgSi2O8 (Jul. 1968), J. Electrochem. Soc., Solid State Science, vol. 115, No. 7, pp. 733-738. (Year: 1968).*

(Continued)

*Primary Examiner* — Natalia A Gondarenko

(57) ABSTRACT

A light emitting diode (LED) device may include an LED die having a first surface on a substrate. A first phosphor layer may be formed on a second surface and sides of the LED die. The second surface may be opposite the first surface. A second phosphor layer may be formed on the first phosphor layer. The second phosphor layer may have a peak emission wavelength ($L_{pk}2$) located between a peak emission wavelength of the LED die ($L_{pk}D$) and a peak emission wavelength of the first phosphor layer ($L_{pk}2$).

13 Claims, 9 Drawing Sheets

(51) Int. Cl.
  *H01L 33/58* (2010.01)
  *C09K 11/02* (2006.01)
  *C09K 11/77* (2006.01)

(58) Field of Classification Search
  CPC ............ C09K 11/7707; C09K 11/7774; H02F 2001/133614
  USPC ........ 257/98, 99, 89, 100, E33.061, E33.059
  See application file for complete search history.

(56) References Cited

U.S. PATENT DOCUMENTS

| | | | |
|---|---|---|---|
| 2010/0044735 A1 | 2/2010 | Oyamada | |
| 2012/0286304 A1* | 11/2012 | LeToquin | H01L 33/504 257/89 |
| 2013/0193465 A1 | 8/2013 | Xu et al. | |
| 2013/0200415 A1* | 8/2013 | Evans | H01L 33/56 257/98 |
| 2015/0108521 A1* | 4/2015 | Hattori | C04B 35/597 257/98 |
| 2015/0270449 A1 | 9/2015 | Park et al. | |
| 2016/0064623 A1 | 3/2016 | Clatterbuck | |
| 2016/0104820 A1* | 4/2016 | Lim | H01L 33/504 257/98 |
| 2016/0172554 A1 | 6/2016 | Basin et al. | |
| 2017/0133559 A1 | 5/2017 | Basin et al. | |
| 2018/0219140 A1 | 8/2018 | Seki et al. | |
| 2019/0013448 A1* | 1/2019 | Nakano | H01L 33/504 |
| 2019/0207062 A1* | 7/2019 | Kim | H01L 33/60 |

FOREIGN PATENT DOCUMENTS

| | | |
|---|---|---|
| TW | I576984 B | 4/2017 |
| WO | 2007/052777 A1 | 5/2007 |
| WO | 2012/154289 A1 | 11/2012 |

OTHER PUBLICATIONS

European Search Report corresponding to EP18201616, dated Mar. 27, 2019, 1 page.
International Search Report corresponding to PCT/US19/48576, dated Nov. 20, 2019, 4 pages.
Written Opinion of the International Searching Authority corresponding to PCT/US19/48576, dated Nov. 20, 2019, 7 pages.
The extended Europeann Search Report, EP18201516.4, dated Apr. 2, 2019, 9 pages.

* cited by examiner

PHOSPHOR CONVERTED LED WITH HIGH COLOR QUALITY

BACKGROUND

Phosphor converted white LED light emitting diode (LED) devices typically use a blue LED that is covered with a layer of luminescent materials that partially absorb the blue LED light and emit green, yellow, and red light. The luminescent materials typically contain a mixed powder of inorganic materials. For high color quality, defined by the Commission on Illumination (CIE) as color rendering indices (CRI), the spectral power distribution (SPD) of light emitted from the LED has to follow closely the SPD of a white reference light. If the light emitted from the LED is used in combination with camera systems (e.g., as a flash), it may be particularly important to avoid sharp peeks and minima in the SPD.

SUMMARY

A light emitting diode (LED) device may include an LED die having a first surface on a substrate. A first phosphor layer may be formed on a second surface and sides of the LED die. The second surface may be opposite the first surface. A second phosphor layer may be formed on the first phosphor layer. The second phosphor layer may have a peak emission wavelength ($L_{pk}2$) located between a peak emission wavelength of the LED die ($L_{pk}D$) and a peak emission wavelength of the first phosphor layer ($L_{pk}2$).

A light emitting diode (LED) device may include an LED die having a first surface on a substrate. A first phosphor layer may be formed on a second surface of the LED die. The second surface may be opposite the first surface. A second phosphor layer may be formed on the first phosphor layer. The second phosphor layer may have a peak emission wavelength ($L_{pk}2$) located between a peak emission wavelength of the LED die ($L_{pk}D$) and a peak emission wavelength of the first phosphor layer ($L_{pk}2$). A reflective coating formed on sides of the LED die, sides of the first phosphor layer, and sides of the second phosphor layer.

BRIEF DESCRIPTION OF THE DRAWINGS

A more detailed understanding may be had from the following description, given by way of example in conjunction with the accompanying drawings, wherein like reference numerals in the figures indicate like elements, and wherein.

DETAILED DESCRIPTION

Figure 1:
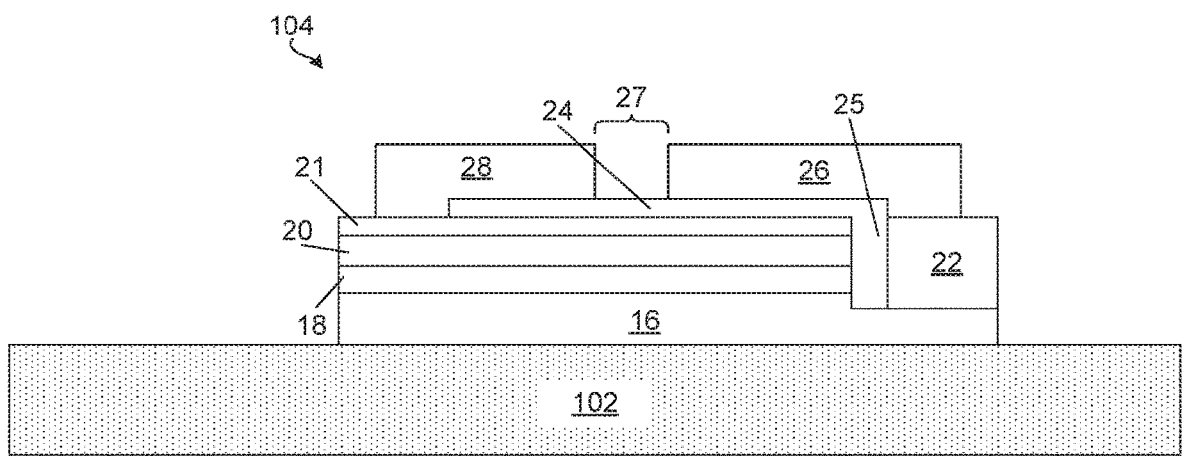
FIG. 1 is a cross section view illustrating an LED die on a substrate.

Examples of different light emitting diode ("LED") implementations will be described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

As described above, for high color quality, defined by the Commission on Illumination (CIE) as color rendering indices (CRI), the spectral power distribution (SPD) of light emitted from the LED has to follow closely the SPD of a white reference light. In order to realize a high CRI, different phosphor materials may have to be applied in order to emit different wavelengths of light. Emissions from phosphors that emit at a shorter wavelength may be absorbed by phosphors that emit at a longer wavelength. This phosphor-phosphor interaction may decrease efficiency due to photon losses in the conversion processes. The phosphor-phosphor interaction may also increase absorption losses in an LED package comprising one or more LED dies due to redirection of emitted light back to the one or more LED dies.

In some applications, it may be desirable to reduce the local minimum in the SPD that is adjacent to the blue emission peak of the LED. The emission peak of a phosphor component may have to be close to the emission peak of the blue LED. When a phosphor material absorbs a photon, it gains energy and enters an excited state. One way for the phosphor material to relax is to emit a photon, thus losing its energy (another method would be the loss of energy as heat). When the emitted photon has less energy than the absorbed photon, this energy difference is the Stokes shift. Stokes fluorescence is the emission of a longer-wavelength photon (lower frequency or energy) by a molecule that has absorbed a photon of shorter wavelength (higher frequency or energy). In other words, the Stokes shift may be the distance between an absorption maximum wavelength and an emission maximum wavelength. Due to the Stokes shift, a large concentration of phosphor material may be required. Reabsorption of emitted light by other phosphors may need to be reduced as much as possible.

The following description includes systems, methods, and apparatuses for using multiple phosphor layers formed on an LED to reduce reabsorption of light emitted by the outermost phosphor layer and increase the efficiency of the LED at high CRI. By using a second phosphor layer having an emission peak located between an emission peak of a first phosphor layer and an emission peak of the LED, the wavelength gap between the LED emissions and the emissions of the first phosphor layer may be filled effectively.

Referring now to FIG. 1, a cross section view illustrating an LED die 104 on a substrate 104 is shown. A first surface of the LED die 104 may located on the substrate 102 and a second surface of the LED die may be located opposite the first surface. The LED die 104 may be any type of conventional semiconductor light emitting device and may be formed, attached, or grown on the substrate 102. FIG. 1 shows an illustrative example of a type of LED die 104 that may be used and is not intended to limit the description below. The LED die 104 may be a type III-nitride LED known in the art. Typically, III-nitride LEDs are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, silicon, formed over the substrate, one or more light emitting layers in an active region (e.g., a p-n diode) formed over the n-type layer or layers, and one or more p-type layers doped with, for example, magnesium, formed over the active region. Electrical contacts are formed on the n-type and p-type regions.

In the examples below, the LED die 104 may emit blue or UV light. However, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

The device of FIG. 1 may be formed by growing a type III-nitride semiconductor structure on a substrate 102 as is known in the art. The substrate 102 may be sapphire or any suitable substrate such as, for example, SiC, Si, GaN, or a composite substrate. A surface of the substrate 102 on which the type III-nitride semiconductor structure is grown may be patterned, roughened, or textured before growth, which may improve light extraction from the device. A surface of the substrate 102 opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration. The n-type region 16 may include preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region 16. Examples of suitable light emitting regions 18 include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped or n-type layers.

After growth, a p-contact may be formed on the surface of the p-type region 18. The p-contact 21 may include multiple conductive layers such as a reflective metal and a guard metal which may prevent or reduce electromigration of the reflective metal. The reflective metal is often silver but any suitable material or materials may be used. A portion of the p-contact 21, the p-type region 20, and the active region 18 may be removed to expose a portion of the n-type region 16 on which an n-contact 22 is formed. The n-contact 22 and the p-contact 21 may be electrically isolated from each other by a gap 25 which may be filled with a dielectric such as an oxide of silicon or any other suitable material. Multiple re-contact vias may be formed. The n-contact 22 and the p-contact 21 are not limited to the arrangement illustrated in FIG. 1. The n-contact 22 and the p-contact 21 may be redistributed to form bond pads with a dielectric/metal stack, as is known in the art.

In order to form electrical connections to the LED die 104, one or more interconnects 26 and 28 may be formed on or electrically connected to the n-contact 22 and the p-contact 21. The interconnect 26 may be electrically connected to re-contact 22. The interconnect 28 may be electrically connected to p-contact 21. The interconnects 26 and 28 may be electrically isolated from the n-contact 22 and the p-contact 21 and from each other by the dielectric layer 24 and a gap 27. The interconnects 26 and 28 may be, for example, solder, stud bumps, gold layers, or any other suitable structure. The semiconductor structure, n-contact 22, p-contact 21, and interconnects 26 and 28 are shown in the following figures as LED structure 104. The substrate 102 may be thinned or entirely removed. The surface of substrate 102 may be exposed by thinning is patterned, textured, or roughened to improve light extraction.

Figure 2:
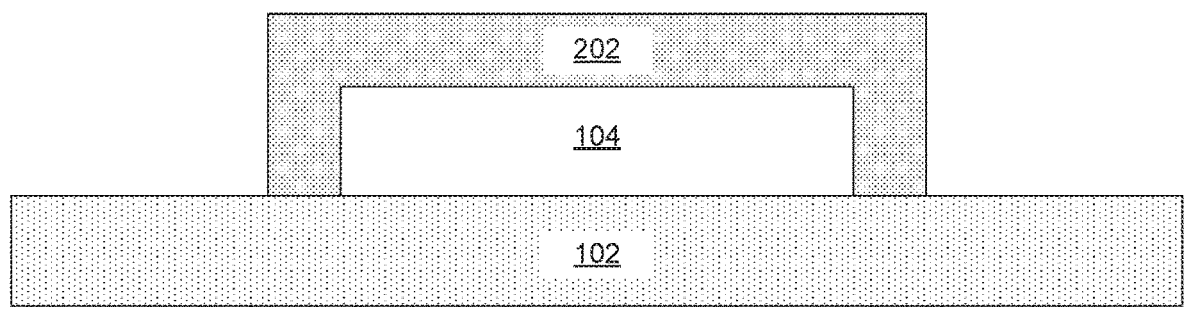
FIG. 2 is a cross section view illustrating forming a first phosphor layer on the LED.

Referring now to FIG. 2, a cross section view illustrating forming a first phosphor layer 202 on the LED die 104 is shown. The first phosphor layer 202 may be applied to the second surface and sides of the LED die 104. The first phosphor layer 202 may have a thickness ranging from approximately 1 μm to approximately 150 μm.

The first phosphor layer 202 may be formed using a conventional deposition process. In an example, the first phosphor layer 202 may be a sheet placed atop the LED die 104 and then processed to conform to the shape of the LED die 104. A combination of vacuum and heat may be used to laminate the first phosphor layer 202 to the LED die 104.

One of skill in the art will recognize that the first phosphor layer 202 need not be in the form of a laminate sheet; it may be applied in liquid or paste form via spray coating, molding, screen printing, and so on. For example, the first phosphor layer 202 may be conformally formed on the LED die 104 using a conventional deposition process such as chemical vapor deposition (CVD), plasma-enhanced CVD (PECVD), atomic layer deposition (ALD), evaporation, sputtering, chemical solution deposition, spin-on deposition, or other like processes.

The first phosphor layer 202 may include a wavelength converting material which may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. The first phosphor layer 202 may include a transparent material such as silicone that is mixed with the wavelength converting material.

The wavelength converting material may absorb light emitted by the LED die 104 and may emit light of one or more different wavelengths. Unconverted light emitted by the LED die 104 may be part of the final spectrum of light extracted from the structure, though it need not be.

In an example, the LED die 104 may be a blue-emitting LED with a peak emission wavelength of $L_{pk}D$.

In an example, the first phosphor layer 202 may comprise a yellow-emitting wavelength converting material, a green-emitting wavelength converting material, and a red-emitting wavelength converting material that have a combined peak emission wavelength of $L_{pk}1$.

The first phosphor layer 202 may comprise one or more phosphor powders in silicone. For example, the first phosphor layer 202 may comprise GaLuAG, SCASN, and CASN. The mass ratio of materials in the first phosphor layer 202 may be approximately 20% SCASN: 80% CASN. The ratio of GaLuAG to total red mass in the first phosphor layer 202 may be approximately 8.47.

In another example, the first phosphor layer 202 may comprise a mixture of a green-emitting wavelength converting material and a red-emitting wavelength converting material. The green-emitting wavelength converting material may include garnets activated with cerium having a chemical composition of $(Y,Gd,Lu)_3(Al,Ga)_5O_{12}$:Ce. The green-emitting wavelength converting material may include silicates and oxynitrides, such as SiAlON, activated with europium. The red-emitting wavelength converting material may include nitrides, such as CASN, SCASN, and BSSN, activated with europium, and quantum dots.

Figure 3:
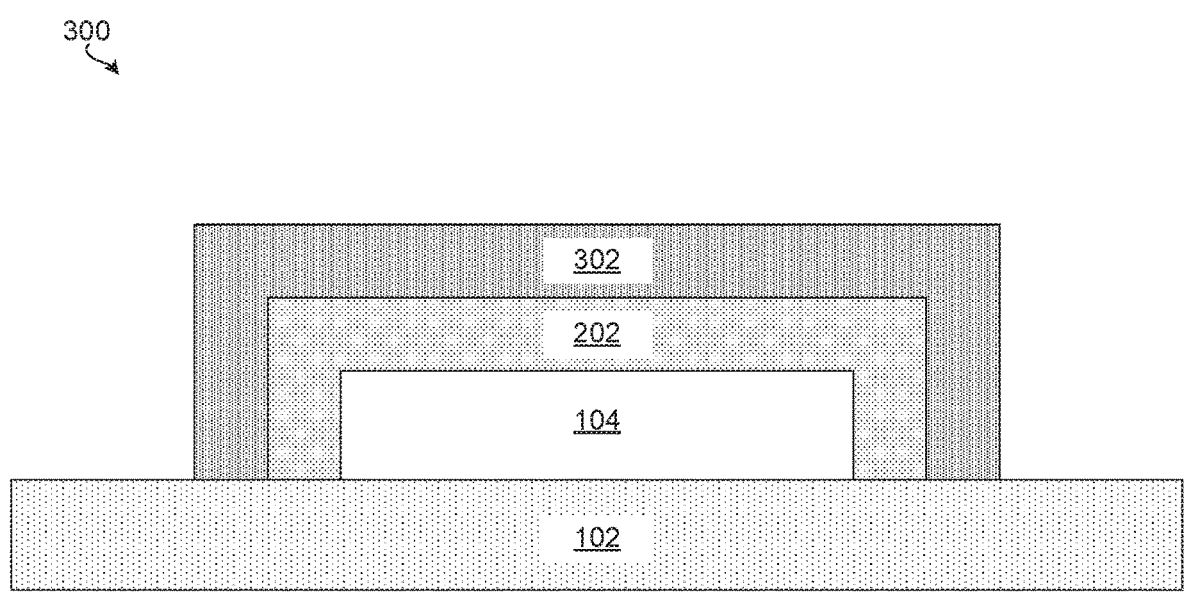
FIG. 3 is a cross section view illustrating forming a second phosphor layer on the first phosphor layer to form a LED device.

Referring now to FIG. 3, a cross section view illustrating forming a second phosphor layer 302 on the first phosphor layer 202 to form an LED device 300 is shown. The second phosphor layer 302 may be applied to the top and sides of the first phosphor layer 202. The second phosphor layer 302 may be formed using any of the techniques describe above with reference to the formation of the first phosphor layer 202. The second phosphor layer 302 may have a thickness ranging from approximately 10 µm to approximately 150 µm.

The second phosphor layer 302 may include a wavelength converting material which may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. The second phosphor layer 302 may include a transparent material such as silicone that is mixed with the wavelength converting material.

The wavelength converting material may absorb light emitted by the LED die 104 and/or the first phosphor layer 202 and may emit light of one or more different wavelengths. Unconverted light emitted by the LED die 104 and/or the first phosphor layer 202 may be part of the final spectrum of light extracted from the structure, though it need not be.

The second phosphor layer 302 may comprise one or more phosphor materials having a peak emission wavelength $L_{pk}2$ that is between $L_{pk}D$ and $L_{pk}1$ (i.e., $L_{pk}D<L_{pk}2<L_{pk}1$). In an example, the peak emission wavelength $L_{pk}2$ may be approximately 100 nm greater than $L_{pk}D$ and approximately 100 nm less than $L_{pk}1$ (i.e., $L_{pk}D+100$ nm$<L_{pk}2<L_{pk}1-100$ nm). In another example, the peak emission wavelength $L_{pk}2$ may be approximately 50 nm greater than $L_{pk}D$ and approximately 50 nm less than $L_{pk}1$ (i.e., $L_{pk}D+50$ nm$<L_{pk}2<L_{pk}1-50$ nm).

In another example, the peak emission wavelength $L_{pk}2$ may be approximately 10 nm greater than $L_{pk}D$ and approximately 10 nm less than $L_{pk}1$ (i.e., $L_{pk}D+10$ nm$<L_{pk}2<L_{pk}1-10$ nm). This range of $L_{pk}2$ may be preferable when the first phosphor layer 202 comprises a mixture of green-emitting wavelength converting material (green) and red-emitting wavelength converting material (red) with a mass ratio of green:red≥1.

The second phosphor layer 302 may comprise $Sr_3MgSi2O_8$:Eu powder in silicone. The mass phosphor of the second phosphor layer 302 to the mass silicone may be equal to 1.

Figure 4:
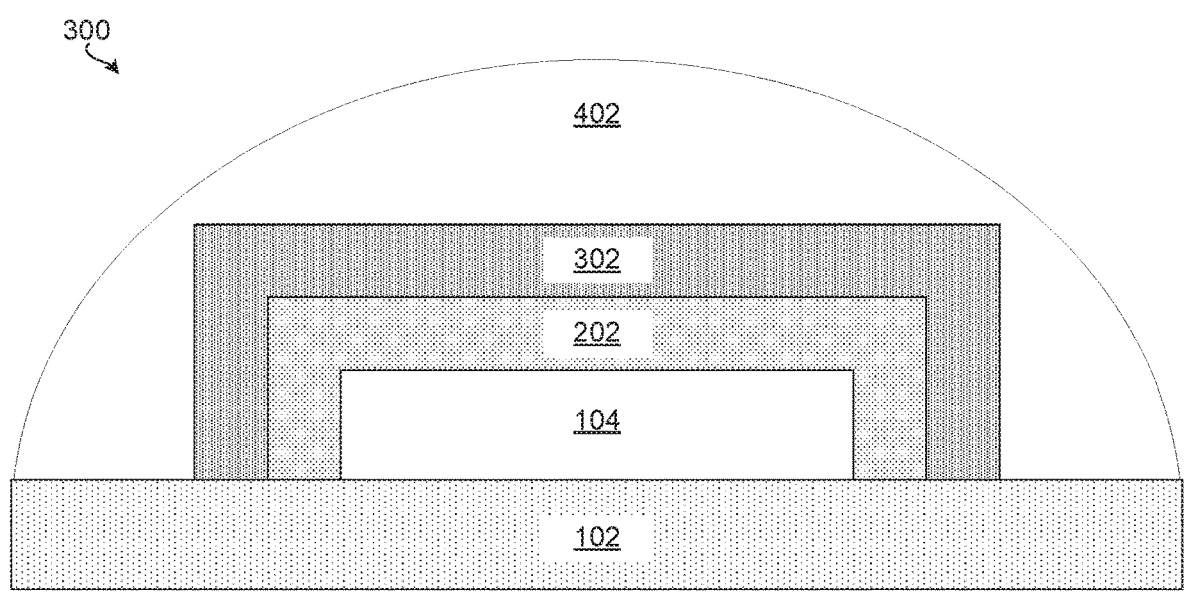
FIG. 4 is a cross section view illustrating optionally forming a lens around the LED device.

Referring now to FIG. 4, a cross section view illustrating optionally forming a lens 402 around the LED device 300 is shown. The lens 402 may be in contact with the substrate 102 and the second phosphor layer 302. The lens 402 may extend out laterally beyond the LED device 300. The lens 402 may comprise a transparent material to improve the extraction of light from the LED device 300. The lens 402 may be formed using conventional deposition techniques. The lens 402 may comprise one or more of the following: PMMA, polycarbonate, silicone, HRPC. One or more portions of the lens may be aluminum coated.

Figure 5:
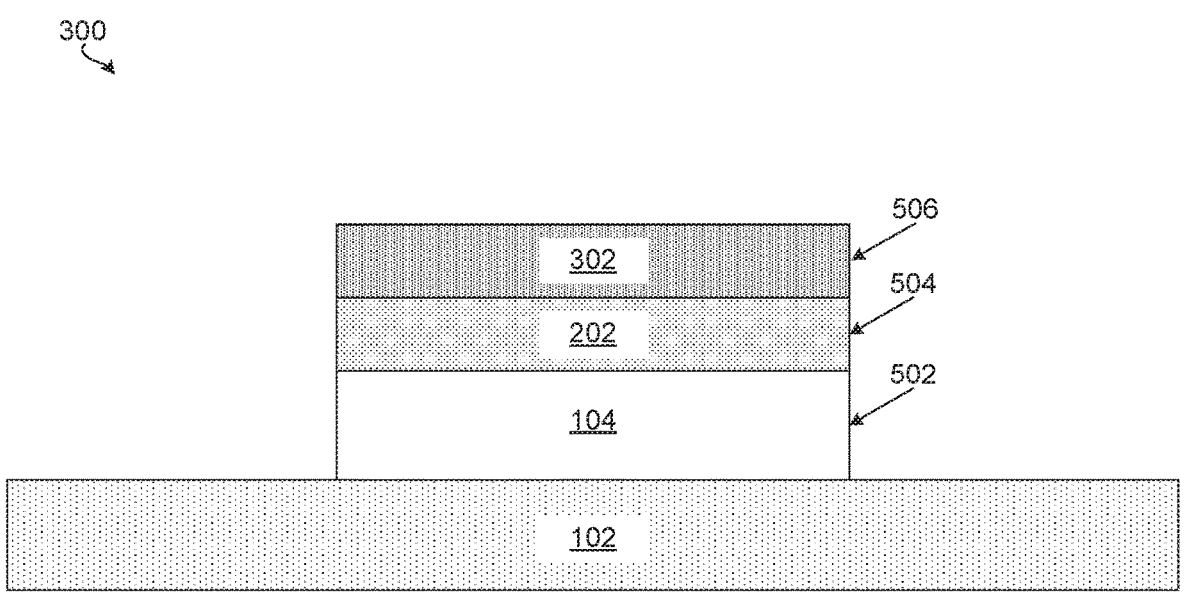
FIG. 5 is a cross-section view illustrating optionally removing portions of the first phosphor layer and the second phosphor layer from the LED device.

Referring now to FIG. 5, a cross-section view illustrating optionally removing portions of the first phosphor layer 202 and the second phosphor layer 302 from the LED device 300 shown in FIG. 3.

The portions of the first the first phosphor layer 202 and the second phosphor layer 302 may be removed using a conventional etching or blasting process. For example, the portions of the first the first phosphor layer 202 and the second phosphor layer 302 may be removed using reactive ion etching (RIE), plasma etching, or a selective etching process.

The remaining portion of the first phosphor layer 202 may have sidewalls 504 that are substantially flush with sidewalls 502 of the LED die 104. The remaining portion of the second phosphor layer 302 may have sidewalls 506 that are substantially flush with the sidewalls 502 of the LED die 104.

Figure 6:
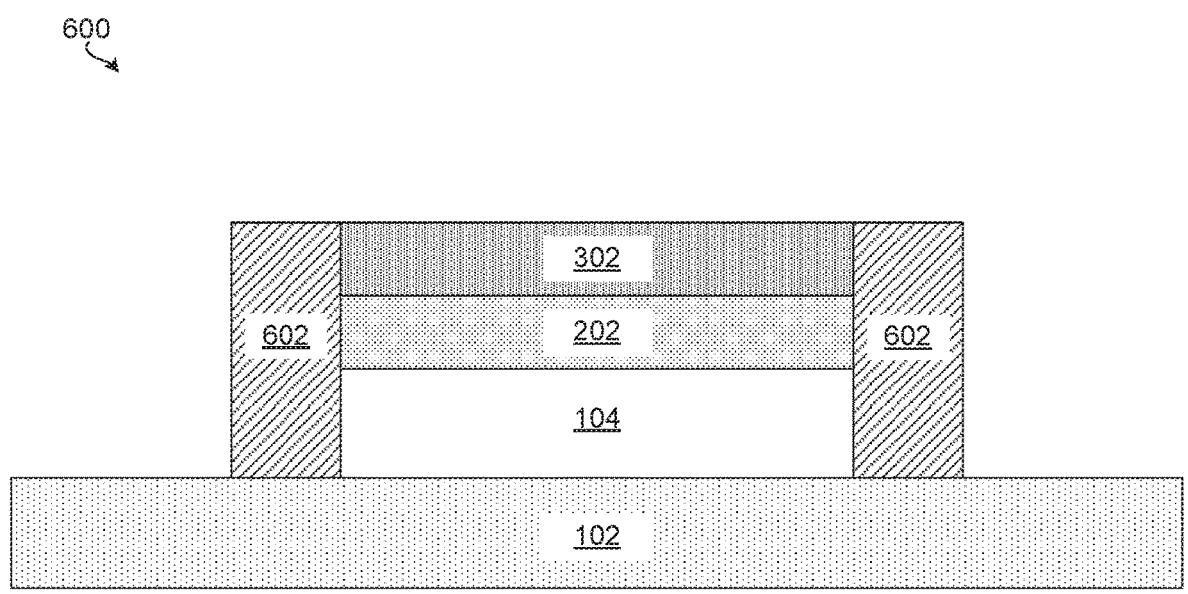
FIG. 6 is a cross-section view illustrating forming a reflective coating on sides of the LED die, the remaining portion of the first phosphor layer, and the remaining portion of the second phosphor layer to form an LED device.

Referring now to FIG. 6, a cross-section view illustrating forming a reflective coating 602 on sides of the LED die 104, the remaining portion of the first phosphor layer 202, and the remaining portion of the second phosphor layer 302 to form an LED device 600.

The reflective coating 602 may be formed using a conventional deposition process. In an example, the reflective coating 602 may be a sheet placed on the sides of the LED die 104 and the remaining portions of the first phosphor layer 202 and the second phosphor layer 302 and then processed to adhere to the LED die 104 and the remaining portions of the first phosphor layer 202 and the second phosphor layer 302. A combination of vacuum and heat may be used to laminate the reflective coating 602 to the LED die 104 and the remaining portions of the first phosphor layer 202 and the second phosphor layer 302.

One of skill in the art will recognize that the reflective coating 602 need not be in the form of a laminate sheet; it may be applied in liquid or paste form via spray coating, molding, screen printing, dispensing, and so on. For example, the first reflective coating 602 may be formed on the substrate 102 adjacent to the LED die 104 using a conventional deposition process such as CVD, PECVD, ALD, evaporation, sputtering, chemical solution deposition, spin-on deposition, or other like processes.

The reflective coating 602 may comprise a metal, such as Ti, Au, Ag, or the like. In an example, the reflective coating 602 may comprise $TiO_2$ powder in a silicone matrix.

The reflective coating 602 may have an upper surface that is substantially flush with an upper surface of the remaining portion of the second phosphor layer 302.

Figure 7:
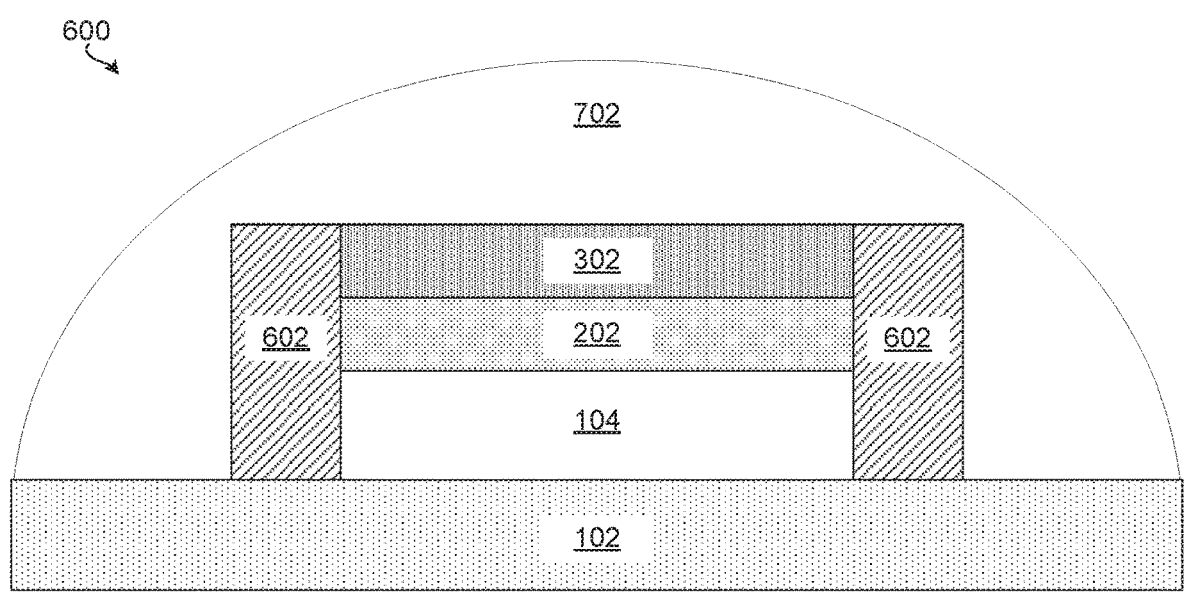
FIG. 7 is a cross section view illustrating optionally forming a lens around the LED device.

Referring now to FIG. 7, a cross section view illustrating optionally forming a lens 702 around the LED device 600 is shown. The lens 702 may be in contact with the substrate 102, the reflective coating 602, and the second phosphor layer 302. The lens 702 may extend out laterally beyond the LED device 600. The lens 702 may comprise a transparent material to improve the extraction of light from the LED device 600. The lens 702 may be formed using conventional deposition techniques. The lens 702 may comprise one or more of the following: PMMA, polycarbonate, silicone, HRPC. One or more portions of the lens may be aluminum coated.

Figure 8:
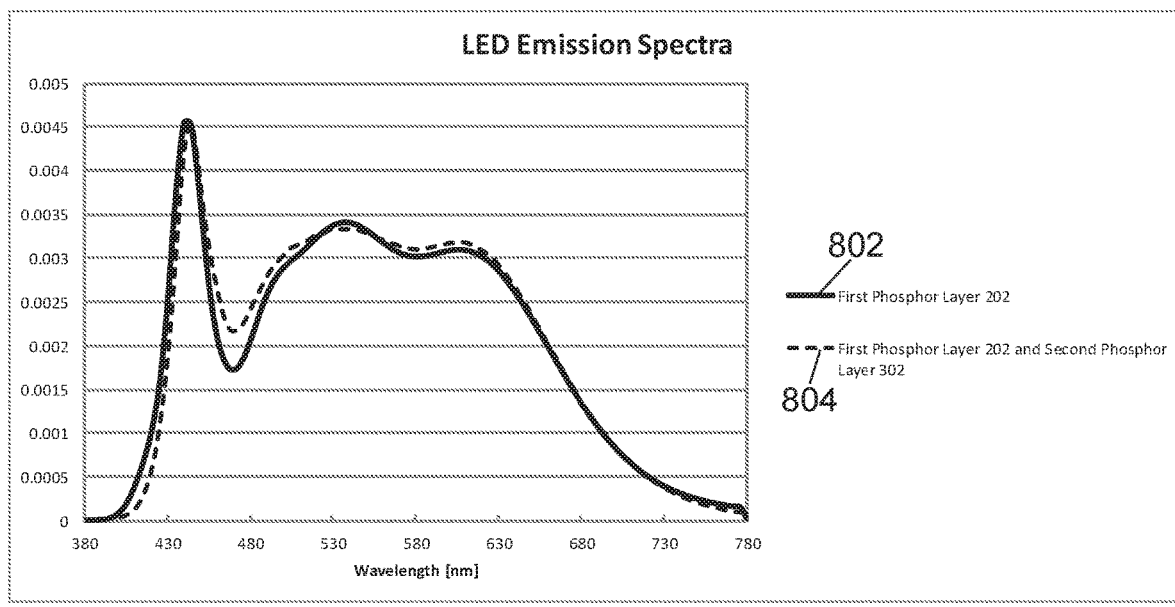
FIG. 8 is a chart illustrating emission spectra comparing the LED die coated with only the first phosphor layer and the LED die coated with both the first phosphor layer and the second phosphor layer.

Referring now to FIG. 8, a chart illustrating a first emission spectrum 802 of the LED die 104 coated with only the first phosphor layer 202 and a second emission spectrum 804 of the LED die 104 coated with both the first phosphor layer 202 and the second phosphor layer 302 is shown. The first emission spectrum 802 and the second emission spectrum 804 may show the same LED wavelength and same color coordinates.

The first emission spectrum 802 and the second emission spectrum 804 may be normalized to the blue LED die 104 emission. As can be seen, the LED die 104 combined with the first phosphor layer 202 and the LED die 104 combined with both the first phosphor layer 202 and the second phosphor layer 302 both emit a light with spectral peaks between blue light (450-490 nm) and red light (635-700 nm). It should be noted that the first phosphor layer 202 for used to generate the first emission spectrum 802 and the first phosphor layer 202 used to generate second emission spectrum 804 may be composed of the same phosphor materials. However, the specific phosphor concentrations in each first phosphor layer 202 may be varied to produce the same color point. In addition, it should be noted that the application of the second phosphor layer 302 may change the emission of the first phosphor layer 202 due to reflection of light which may be absorbed and converted by the first phosphor layer 202.

The local minimum in the SPD following the blue emission peak of the LED die 104 with both phosphor layers may be increased to as compared with only the first phosphor layer 202. This may be seen in Table 1 below.

TABLE 1

| | Emission Characteristics | | | | | | |
|---|---|---|---|---|---|---|---|
| | Blue peak wavelength [nm] | CCT (K) | LE | CRI(Ra) | CRI(R 9) | Spectral minimum | x Color Coord | y Color Coord. |
| Layer 1 | 440.5 | 5325 | 286.5 | 91.4 | 63.8 | 38.20% | 0.337 | 0.353 |
| Layer 1 and Layer 2 | 440.5 | 5325 | 288.3 | 94.2 | 66.5 | 48.00% | 0.337 | 0.353 |

The coloring rendering index CRI(Ra) for the SPD of the LED die 104 with both phosphor layers increases to a CRI(Ra) of 94.2 as compared to a CRI(Ra) of 91.4 for the LED die 104 with only the first phosphor layer 202. The local minimum in the SPD following the blue emission peak of the LED die 104 with both phosphor layers may increase to 48% of LED peak as compared to 38.2% of LED peak height with the LED die 104 with only the first phosphor layer 202.

Figure 9:
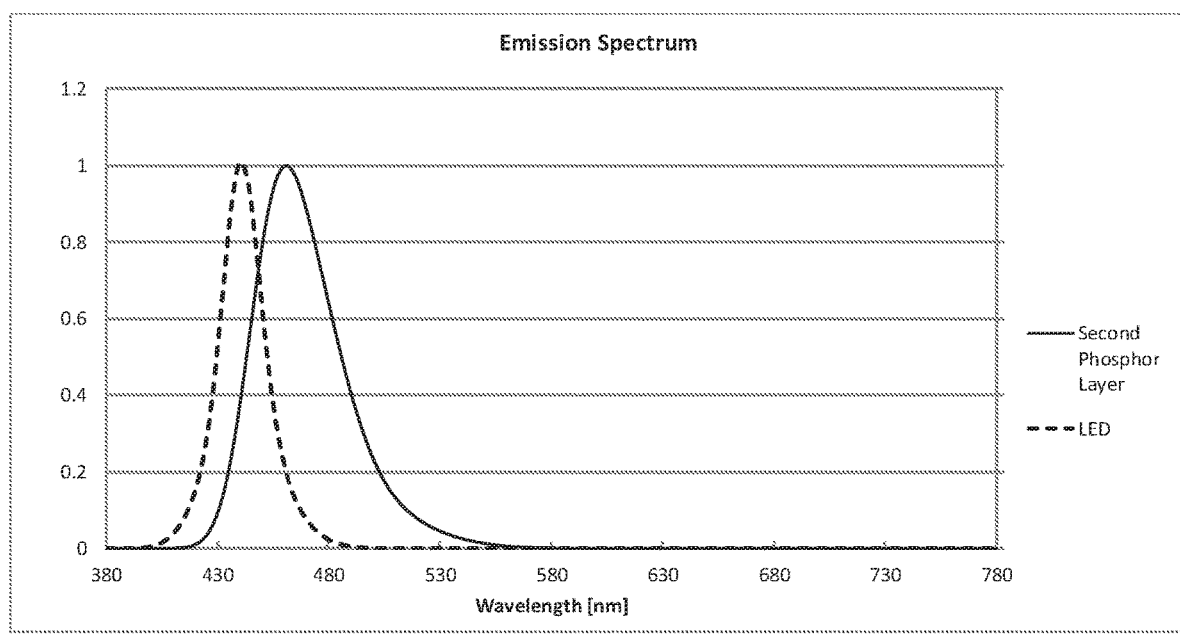
FIG. 9 is a chart illustrating the emission spectra of the second phosphor layer and the LED die.

Referring now to FIG. 9, a chart illustrating the emission spectra of the second phosphor layer 302 and the LED die 104 is shown. As described above, the second phosphor layer 302 may comprise one or more phosphor materials having a peak emission wavelength $L_{pk}2$ that is between $L_{pk}D$ of the LED die 104 and $L_{pk}1$ of the first phosphor layer 202 (i.e., $L_{pk}D<L_{pk}2<L_{pk}1$). The chart shows an example in which $L_{pk}2$ is approximately $L_{pk}D+10$ nm.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A light emitting diode (LED) device comprising:
    an LED die configured to emit blue light having a peak emission wavelength;
    a first phosphor layer disposed on the LED die and configured to emit green, yellow, and red light upon excitation by the blue light emitted from the LED die; and a second phosphor layer disposed on the first phosphor layer opposite from the LED die and comprising a $Sr_3MgSi_2O_8$:Eu phosphor configured to emit light having a peak emission wavelength at approximately 10 to 50 nanometers longer than the peak emission wavelength of the LED die upon excitation by the blue light emitted from the LED die, the $Sr_3MgSi_2O_8$:Eu phosphor configured to increase a spectral power distribution (SPD) of the LED device at a local minimum of approximately 470 nanometers as compared with an SPD emission of the LED device without the second phosphor layer, the $Sr_3MgSi_2O_8$:Eu phosphor configured to produce an x color coordinate of a spectral emission of the LED device that is substantially the same as an x color coordinate of a spectral emission of the LED device without the second phosphor layer.

2. The LED device of claim 1, wherein the peak emission wavelength of the second phosphor layer is approximately 10 nm longer than the peak emission wavelength of the LED die.

3. The LED device of claim 1, wherein the peak emission wavelength of the second phosphor layer is approximately 10 nm to 20 nm shorter than a peak emission wavelength of the first phosphor layer.

4. The LED device of claim 1, further comprising:
a lens surrounding the LED die, the first phosphor layer, and the second phosphor layer.

5. The LED device of claim 1, wherein the first phosphor layer comprises $Y_3(Al,Ga)_5O_{12}$, $Lu_3(Al,Ga)_5O_{12}$, SCASN, and CASN in silicone.

6. The LED device of claim 5, wherein a mass ratio SCASN to CASN is approximately 20:80.

7. The LED device of claim 5, wherein a ratio of $Lu_3(Al,Ga)_5O_{12}$ to SCASN and CASN is approximately 8.47.

8. The LED device of claim 1, further comprising:
a reflective coating formed on sides of the LED die, sides of the first phosphor layer, and sides of the second phosphor layer.

9. The LED device of claim 8, wherein the reflective coating comprises $TiO_2$ in silicone.

10. The LED device of claim 1, wherein the peak emission wavelength of the LED die is approximately 440 nanometers.

11. The LED device of claim 1, wherein the peak emission wavelength of the second phosphor is approximately 20 nm to 40 nm longer than the peak emission wavelength of the LED die.

12. The LED device of claim 5, wherein a ratio of $Y_3(Al,Ga)_5O_{12}$ and $Lu_3(Al,Ga)_5O_{12}$ to SCASN and CASN is greater than 5 and less than 10.

13. The LED device of claim 1, wherein the peak emission wavelength of the second phosphor layer is approximately 460 nanometers.

* * * * *